(12) United States Patent
Mongia et al.

(10) Patent No.: US 9,851,766 B2
(45) Date of Patent: *Dec. 26, 2017

(54) APPARATUS AND METHOD TO EFFICIENTLY COOL A COMPUTING DEVICE

(71) Applicant: Intel Corporation, Santa Clara, CA (US)

(72) Inventors: Rajiv K. Mongia, Fremont, CA (US); Sridhar V. Machiroutu, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/919,271

(22) Filed: Oct. 21, 2015

(65) Prior Publication Data

US 2016/0062420 A1     Mar. 3, 2016

Related U.S. Application Data

(60) Continuation of application No. 14/711,638, filed on May 13, 2015, which is a division of application No. 11/244,496, filed on Sep. 30, 2005, now Pat. No. 9,047,066.

(51) Int. Cl.
*H05K 7/20* (2006.01)
*G06F 1/20* (2006.01)
*H01L 23/467* (2006.01)

(52) U.S. Cl.
CPC .......... *G06F 1/203* (2013.01); *H01L 23/467* (2013.01); *H05K 7/20145* (2013.01); *H01L 2924/0002* (2013.01)

(58) Field of Classification Search
CPC ................ G06F 1/203; H05K 7/127–7/20145
See application file for complete search history.

(56) References Cited

U.S. PATENT DOCUMENTS

| 4,277,816 A | 7/1981 | Dunn et al. |
|---|---|---|
| 4,399,484 A | 8/1983 | Mayer |
| 4,661,669 A | 4/1987 | Matsushima et al. |

(Continued)

FOREIGN PATENT DOCUMENTS

| DE | 202004003310 U | 8/2004 |
|---|---|---|
| TW | 488606 | 5/2002 |

(Continued)

OTHER PUBLICATIONS

Final Office Action dated Jun. 16, 2010, U.S. Appl. No. 11/967,679, 9 pages.

(Continued)

*Primary Examiner* — Robert J Hoffberg
(74) *Attorney, Agent, or Firm* — Patent Capital Group

(57) ABSTRACT

Embodiments disclosed herein include devices to cool the walls of a mobile computing device. In one embodiment, a louvered vent is formed within an external wall of a mobile computing device to create an air curtain between the external wall and a heat generating component to cool the external wall. In another embodiment, a nozzle vent is formed within the external wall of a mobile computing device to flow cooling air at a heat generating component to cool the heat generating component.

19 Claims, 6 Drawing Sheets

(56) References Cited

U.S. PATENT DOCUMENTS

| | | | |
|---|---|---|---|
| 4,726,285 A * | 2/1988 | Kelley | F24F 13/068 454/284 |
| 4,897,762 A | 1/1990 | Daikoku et al. | |
| 4,949,218 A | 8/1990 | Blanchard et al. | |
| 5,063,476 A | 11/1991 | Hamadah et al. | |
| 5,259,817 A * | 11/1993 | Schumacher | F24F 13/068 454/296 |
| 5,285,350 A | 2/1994 | Villaume | |
| 5,313,362 A | 5/1994 | Hatada et al. | |
| 5,331,508 A | 7/1994 | Hosoi et al. | |
| 5,424,915 A | 6/1995 | Katooka et al. | |
| 5,428,503 A | 6/1995 | Matsushima et al. | |
| 5,519,585 A | 5/1996 | Jones et al. | |
| 5,563,768 A | 10/1996 | Perdue | |
| 5,694,294 A | 12/1997 | Ohashi et al. | |
| 5,953,206 A | 9/1999 | Jondrow | |
| 5,969,942 A * | 10/1999 | Heckner | H05K 7/207 165/121 |
| 6,005,770 A | 12/1999 | Schmitt | |
| 6,027,535 A | 2/2000 | Eberle et al. | |
| 6,069,791 A | 5/2000 | Goto et al. | |
| 6,175,495 B1 | 1/2001 | Batchelder | |
| 6,181,557 B1 | 1/2001 | Gatti | |
| 6,226,180 B1 | 5/2001 | Ueda et al. | |
| 6,226,182 B1 | 5/2001 | Maehara | |
| 6,229,701 B1 | 5/2001 | Kung et al. | |
| 6,237,144 B1 | 5/2001 | Delo | |
| 6,243,261 B1 | 6/2001 | Janik et al. | |
| 6,252,160 B1 | 6/2001 | Chang et al. | |
| 6,259,601 B1 | 7/2001 | Jaggers et al. | |
| 6,336,691 B1 * | 1/2002 | Maroney | H05K 7/20127 312/213 |
| 6,348,653 B1 | 2/2002 | Cho | |
| 6,364,009 B1 | 4/2002 | MacManus et al. | |
| 6,385,043 B1 | 5/2002 | Ueda et al. | |
| 6,421,238 B1 | 7/2002 | Negishi | |
| 6,430,042 B1 | 8/2002 | Ohashi et al. | |
| 6,459,573 B1 | 10/2002 | Distefano et al. | |
| 6,459,574 B1 * | 10/2002 | Ghosh | G06F 1/203 165/80.4 |
| 6,507,493 B2 | 1/2003 | Ueda et al. | |
| 6,577,502 B1 | 6/2003 | Distefano et al. | |
| 6,588,497 B1 | 7/2003 | Glezer et al. | |
| 6,599,090 B2 | 7/2003 | Ozaki et al. | |
| 6,618,248 B1 | 9/2003 | Dalheimer | |
| 6,678,157 B1 | 1/2004 | Bestwick | |
| 6,717,808 B2 | 4/2004 | Ueda et al. | |
| 6,724,624 B1 | 4/2004 | Dodson | |
| 6,760,649 B2 | 7/2004 | Cohen | |
| 6,765,796 B2 | 7/2004 | Hoffman et al. | |
| 6,801,430 B1 | 10/2004 | Pokharna | |
| 6,847,524 B2 | 1/2005 | Tomioka et al. | |
| 6,882,108 B2 * | 4/2005 | Kim | H05K 7/20972 313/46 |
| 6,909,602 B2 | 6/2005 | Dietrich et al. | |
| 6,947,294 B2 | 9/2005 | Lin et al. | |
| 6,972,950 B1 | 12/2005 | Wyatt et al. | |
| 6,991,533 B2 | 1/2006 | Tsai et al. | |
| 7,031,154 B2 | 4/2006 | Bash et al. | |
| 7,167,363 B1 | 1/2007 | Cushman et al. | |
| 7,173,822 B2 | 2/2007 | Liang et al. | |
| 7,201,651 B2 | 4/2007 | Su | |
| 7,210,946 B2 | 5/2007 | Chen | |
| 7,248,471 B2 | 7/2007 | Wabiszczewicz | |
| 7,251,139 B2 | 7/2007 | Bhattacharya et al. | |
| 7,310,227 B2 | 12/2007 | Kusamoto et al. | |
| 7,312,988 B2 | 12/2007 | Maeda | |
| 7,355,851 B2 | 4/2008 | Lanni | |
| 7,362,574 B2 | 4/2008 | Campbell et al. | |
| 7,375,962 B2 | 5/2008 | Campbell et al. | |
| 7,403,385 B2 | 7/2008 | Boone et al. | |
| 7,416,481 B2 | 8/2008 | Baker et al. | |
| 7,529,087 B2 * | 5/2009 | Dubrule | G06F 1/20 361/679.5 |
| 7,764,514 B2 * | 7/2010 | Mongia | H05K 9/0041 174/382 |
| 7,872,865 B2 | 1/2011 | Matsushima et al. | |
| 7,884,468 B2 | 2/2011 | Mann et al. | |
| 7,957,140 B2 * | 6/2011 | Mongia | G06F 1/203 165/104.33 |
| 8,169,779 B2 | 5/2012 | Le et al. | |
| 8,451,600 B1 * | 5/2013 | Ross | H05K 7/20545 165/80.3 |
| 9,047,066 B2 * | 6/2015 | Mongia | G06F 1/203 |
| 2002/0122296 A1 | 9/2002 | Stone et al. | |
| 2003/0121645 A1 | 7/2003 | Wang | |
| 2003/0156385 A1 | 8/2003 | Askeland et al. | |
| 2003/0210523 A1 | 11/2003 | Tuttle et al. | |
| 2004/0001316 A1 | 1/2004 | Kamikawa et al. | |
| 2004/0016257 A1 | 1/2004 | Wei | |
| 2004/0027069 A1 * | 2/2004 | Kim | H05K 7/20972 313/582 |
| 2004/0085730 A1 | 5/2004 | Lo | |
| 2004/0123978 A1 | 7/2004 | Hashimoto et al. | |
| 2004/0125558 A1 | 7/2004 | Distefano | |
| 2004/0130869 A1 | 7/2004 | Fleck et al. | |
| 2004/0217072 A1 | 11/2004 | Bash et al. | |
| 2005/0013116 A1 | 1/2005 | Pokharna et al. | |
| 2005/0111185 A1 | 5/2005 | Bhattacharya et al. | |
| 2006/0120043 A1 | 6/2006 | Wolford et al. | |
| 2006/0133036 A1 | 6/2006 | Durney | |
| 2006/0193113 A1 | 8/2006 | Cohen et al. | |
| 2006/0198104 A1 | 9/2006 | Chang et al. | |
| 2007/0064388 A1 | 3/2007 | Uchizono et al. | |
| 2007/0076370 A1 | 4/2007 | Mongia et al. | |
| 2008/0117590 A1 | 5/2008 | Dey et al. | |
| 2009/0168332 A1 | 7/2009 | Mongia | |
| 2010/0014247 A1 * | 1/2010 | Wang | H05K 7/20145 361/692 |
| 2012/0069520 A1 | 3/2012 | Kaneko et al. | |
| 2015/0253824 A1 | 9/2015 | Mongia et al. | |
| 2016/0062420 A1 | 3/2016 | Mongia et al. | |

FOREIGN PATENT DOCUMENTS

| | | |
|---|---|---|
| TW | M256998 | 2/2005 |
| TW | 229790 | 3/2005 |

OTHER PUBLICATIONS

First Office Action dated Mar. 23, 2010, Chinese Patent Application No. 200680035883.3.

Garino et al., "Characterization for Laminar Jet Impingement Cooling in Portable Computer Applications," IEEE Transactions on Components and Packaging Technologies, vol. 32, No. 3, Sep. 2002, pp. 337-346.

International Search Report and Written Opinion of the International Searching Authority, jApplication No. PCT/US2006/037759 dated Jan. 8, 2007.

Guarino John et al, "Characterization of Laminar Jet Impingement Cooling in a Portable Computer Applications", IEEE Transaction on Components and Packaging Technologies, IEEE Service Center, Piscataway, NJ, US, vol. 25, No. 3, Sep. 2002 (Sep. 2009), pp. 337-346.

Office Action received for Chinese Patent Application No. 200680035883.3, dated Oct. 9, 2012, 11 pages including 6 pages English translation.

Unknown, Streetwise: Power Support –4C Vent Laptop Cooling Stand 17", webdocument, streetwise.com.au, 2 pages.

Unknown, Top 9 Laptop Computer Safety Tips, web document, Laptop ComputerSafety, 3 pages total.

Vader et al., "Nozzle for Enhanced Impingement Cooling," IP. Com. Journal, IP. COM, INC., West Henrietta, NY, US, Aug. 1, 1991; number of pp. 3.

Final Office Action in U.S. Appl. No. 14/711,638 dated Apr. 12, 2017.

* cited by examiner

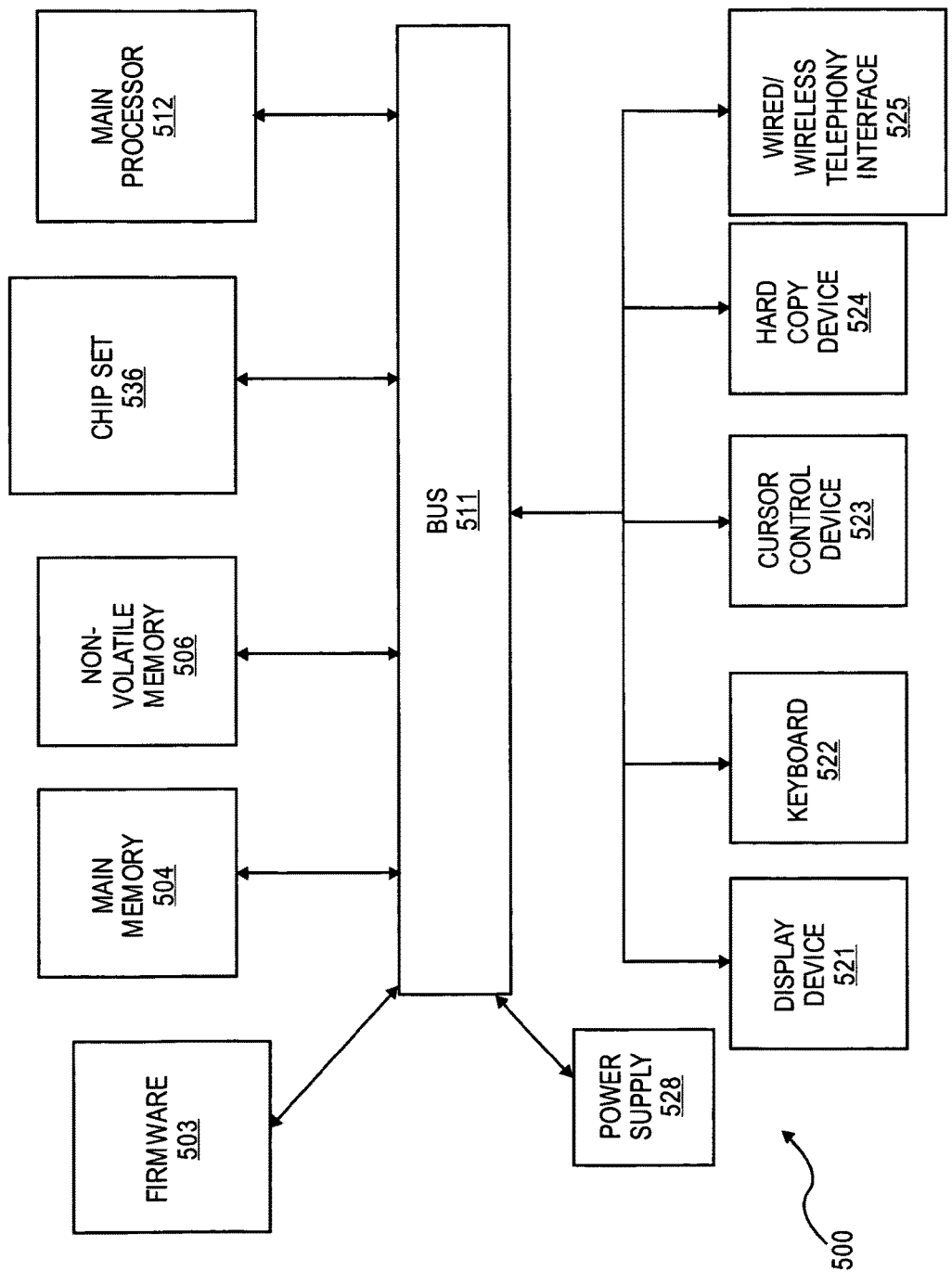

APPARATUS AND METHOD TO EFFICIENTLY COOL A COMPUTING DEVICE

CROSS-REFERENCE TO RELATED APPLICATIONS

This application is a continuation of and claims the benefit of priority to previously filed U.S. patent application Ser. No. 14/711,638, filed May 13, 2015, entitled "Apparatus and Method to Efficiently Cool a Computing Device," which is a divisional of and claims the benefit of priority to previously filed U.S. patent application Ser. No. 11/244,496, filed Sep. 30, 2005, entitled "Apparatus and Method to Efficiently Use Cooling Air", both of which are incorporated herein by reference in their entirety.

BACKGROUND

1. Field

The present invention relates to the field of heat management of computing devices, and in particular the cooling of heat generating components and exterior walls of mobile computing devices.

2. Discussion of Related Art

Heat management can be critical in many applications. Excessive heat can cause damage to or degrade the performance of mechanical, chemical, electric, and other types of devices. Heat management becomes more critical as technology advances and newer devices continue to become smaller and more complex, and as a result run at higher power levels and/or power densities.

Modern electronic circuits, because of their high density and small size, often generate a substantial amount of heat. Complex integrated circuits (ICs), especially microprocessors, generate so much heat that they are often unable to operate without some sort of cooling system. Further, even if an IC is able to operate, excess heat can degrade an IC's performance and can adversely affect its reliability over time. Inadequate cooling can cause problems in central processing units (CPUs) used in personal computers (PCs), which can result in system crashes, lockups, surprise reboots, and other errors. The risk of such problems can become especially acute in the tight confines found inside mobile computers and other portable computing and electronic devices.

As the processing powers of mobile computing devices continue to increase, the temperatures of the outer walls of the mobile computing devices will continue to rise to unacceptable levels. The temperatures are becoming the highest within the regions of the memory, central processing unit (CPU), chipset and voltage regulator (VR). To overcome the increase of heat in these locations, vents have been placed in strategic locations to reduce the temperatures.

Prior methods for dealing with such cooling problems have included using simple vent systems in the outer walls of a mobile device. But, as the amount of cooling air available within mobile computing devices is reduced as the mobile devices are scaled down, the vent system becomes less and less efficient.

BRIEF DESCRIPTION OF THE DRAWINGS

FIG. 5 is an illustration of an embodiment of a mobile computing device system that may employ embodiments of louvered vents or nozzle vents to cool the mobile computing device system.

DETAILED DESCRIPTION

Described herein are methods and devices to decrease the temperatures of the walls of mobile computing devices and of the components within the mobile computing devices. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

Embodiments disclosed herein include devices to cool the walls of a mobile computing device and to cool the heat generating components of the mobile computing device. In one embodiment, a louvered vent is formed within an external wall of a mobile computing device to create an air curtain between the external wall and a heat generating component to cool the external wall. In another embodiment, a nozzle vent is formed within the external wall of a mobile computing device to flow cooling air at a heat generating component to cool the heat generating component.

Figure 1A:
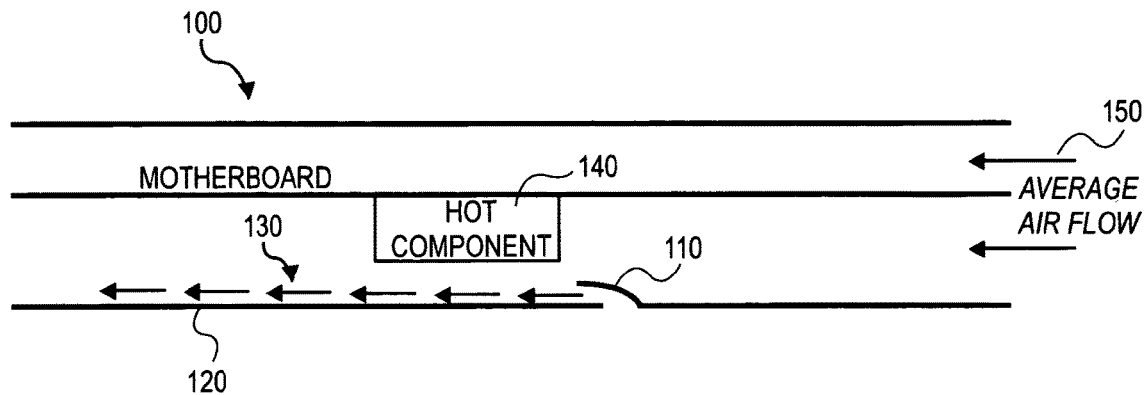
FIG. 1A is an illustration of an embodiment of a cross-sectional view of a louvered vent within a mobile computing device.
Figure 1B:
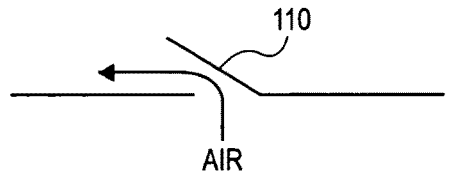
FIGS. 1B-1D illustrate cross-sectional views of different embodiments of the shape of the louvered vent.
Figure 1C:
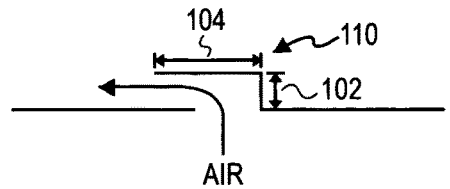
Figure 1D:
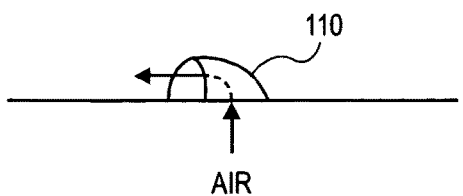

FIG. 1A illustrates an embodiment of a louvered vent 110 that has been formed within the external wall 120 of a mobile computing device 100 to form an air curtain 130 between the external wall 120 and a heat generating component 140 to cool the external wall. An air curtain 130 is a thin film of air that is formed along the inside of the external wall 120. The air curtain 130 is formed inside the mobile computing device 100 to supplement the average airflow 150 available on the inside of the mobile computing device 100. The air curtain 130 is formed by the fluid dynamics of the louvered vent 110. The purpose of the air curtain 130 is to isolate the external wall 120 from the heat generating components 140. The shape of the louvered vent 110 is designed to redirect the flow of the air coming into the mobile computing device 100 from outside of the external wall 120. The louvered vent 110 illustrated in FIG. 1A is a curved louvered vent 110. FIGS. 1B, 1C and 1D illustrate alternative embodiments of the shape of the louvered vent 110.

In FIG. 1B an angled louvered vent 110 is illustrated. The angled louvered vent 110 of FIG. 1B may have any angle with respect to the external wall 120 that is sufficient to form a curtain of cooling air 130, but more particularly may have an angle with respect to the external wall 120 in the approximate range of 15 degrees and 45 degrees.

FIG. 1C illustrates a squared of chamber louvered vent 110. The height 102 of the squared off chamber may vary depending on the dimensions of the interior of the mobile computing device 100, but in one particular embodiment where the mobile computing device 100 is a laptop computer, the height 102 of the squared off chamber may be in the approximate range of 1 millimeters (mm)-3 mm. The length 104 of the squared off chamber louvered vent 110 may be any length sufficient to form the air curtain 130 along the external wall 120.

FIG. 1D illustrates a hooded louvered vent 110. The hooded louvered vent 110 may be curved, angled, or squared and forms an enclosed louvered vent 110 to more specifically focus the air curtain 130. The hooded louvered vent 110 may have a width and a height sufficient to create an air curtain 130 that is capable of reducing the temperature of the external wall 120.

Figure 2A:
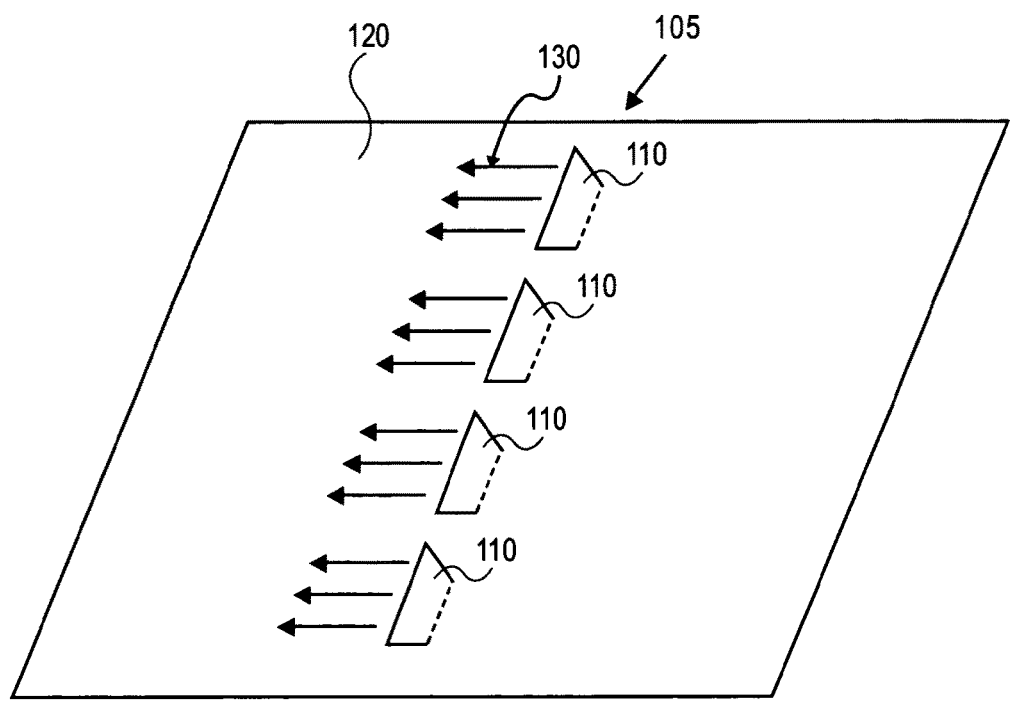
FIG. 2A is an illustration of an overhead view of an embodiment of the inside surface of a wall having a row of louvered vents.
Figure 2B:
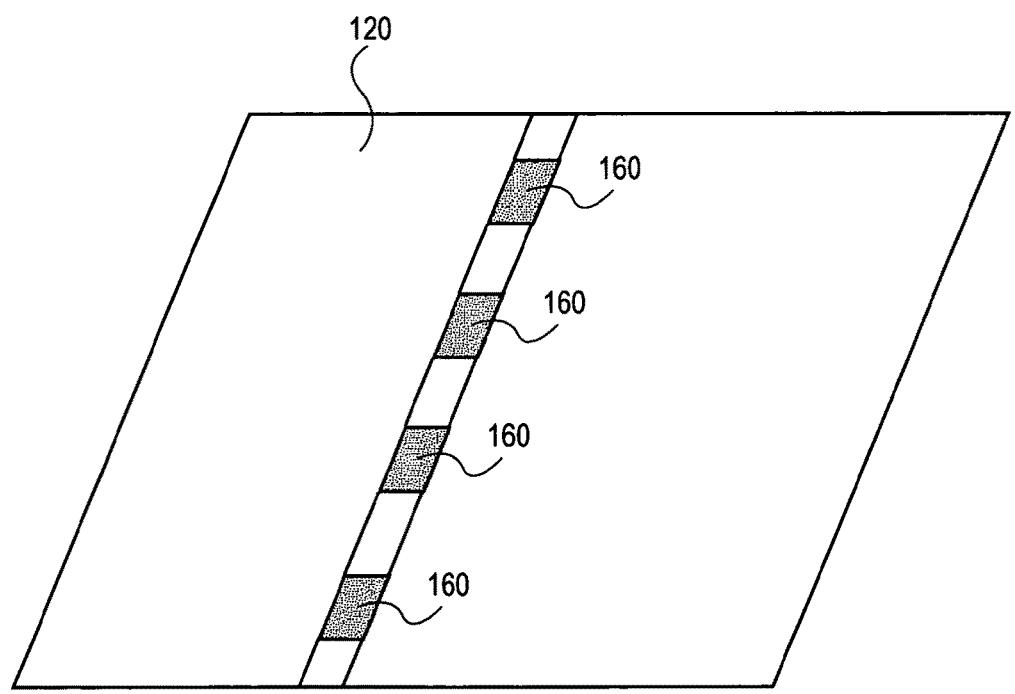
FIG. 2B is an illustration of an overhead view of an embodiment of the outside surface of a wall having a row of louvered vents.

FIGS. 2A and 2B illustrate an embodiment of angled louvered vents 110 formed in a row 105 in an external wall 120 of a mobile computing device 100. FIG. 2A illustrates a top view of the inside surface of the external wall 120. The row 105 of louvered vents 110 is seen in this figure. A row 105 of louvered vents 110 may be used to form many air curtains 130 along the inside surface of the external wall 120. The multiple air curtains 130 may in effect form a continuous air curtain 130. FIG. 2B illustrates a bottom view of the outside surface of the external wall 120 to illustrate the openings 160 of the louvered vents 110. In an alternate embodiment, not shown, a louvered vent 110 may be formed that crosses a substantial width or length of the external wall 120. Many variations of length, width, and positioning of the louvered vents 110 may be used depending on the placement of the heat generating components 140 within the mobile computing device and depending on how many air curtains are sufficient to cool the external wall 120.

Figure 2C:
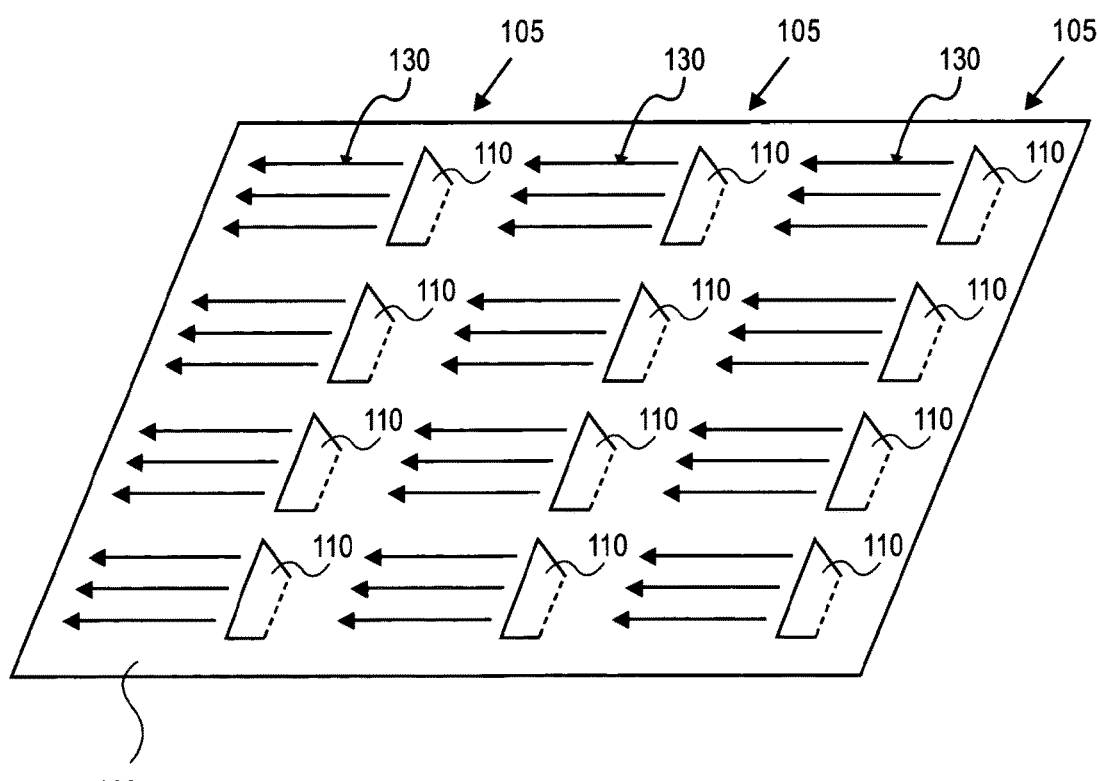
FIG. 2C is an illustration of an overhead view of an embodiment of the outside surface of a wall having a series of rows of louvered vents.

FIG. 2C illustrates an embodiment where a series of rows 105 of louvered vents 110 are positioned to create an air curtain formed of the combined series of air curtains 130 over substantially the entire external wall 120. The rows 105 of the louvered vents may be positioned approximately 10 mm-30 mm apart. The distance between the rows 105 of louvered vents 110 is determined by the distance at which the air curtain begins to break up so that the next row 105 of louvered vents 110 can take over to form an air curtain over the external wall 120 to cool the external wall 120.

In an embodiment, the positioning of the louvered vents 110 may be determined by the placement of the heat generating components within the mobile computing device 100. In this embodiment, the louvered vents 110 may be positioned to one side of the heat generating components 140 so that an air curtain 130 is formed substantially beneath the heat generating components 140 as illustrated in FIG. 1A. The louvered vents 110 described in these embodiments may decrease the temperature of the external wall 120 by approximately 20%-25% or more. The amount by which the temperature of the external wall 120 is decreased may vary depending on the type of louvered vent 110, the number of louvered vents 110, and the positioning of the louvered vents 110.

The louvered vents 110 may be formed within the external wall 120 by machining, stamping, or molding, for example. The louvered vents 110 may be formed of any material such as plastic polymers or metal. In one embodiment, the louvered vents 110 are formed of metal and have a length sufficient to provide electromagnetic interference (EMI) shielding.

Figure 3A:
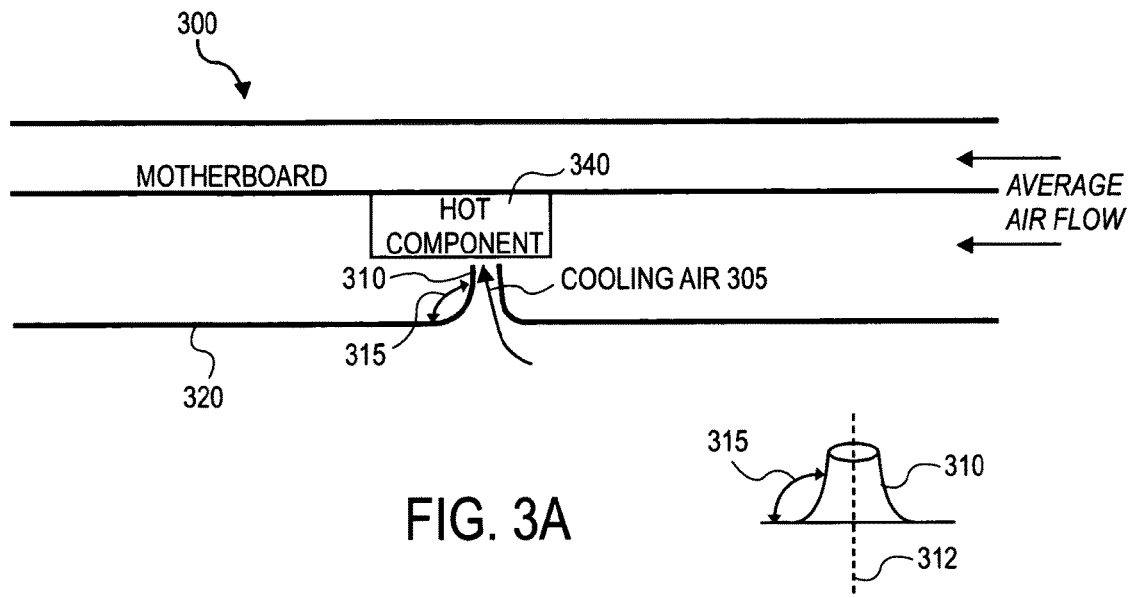
FIG. 3A is an illustration of a cross-sectional view of an embodiment of a nozzle vent within a mobile computing device.

FIG. 3A illustrates an embodiment of a mobile computing device 300 having a nozzle vent 310. The mobile computing device 300 has a heat generating component 340 and an external wall 320 near the heat generating component 340. The nozzle vent 310 is formed within the external wall 320 to flow cooling air at the heat generating component 340. By directing the flow of the cooling air 305 through the nozzle vent 310, significant heat transfer rates between the cooling air 305 and the heat generating component 340 can be achieved. Additionally, the use of the available cooling air is maximized. In one embodiment, the center vertical axis 312 of the nozzle vent 310 of FIG. 3A may be at a 90 degree angle with respect to the external wall 320 and pointed directly at the heat generating component 340. In an alternate embodiment, the center vertical axis 312 of the nozzle vent 310 may be angled with respect to the external wall 320. The angle 315 that is formed between the external wall 320 and the center vertical axis 312 of the nozzle jet may be between approximately 30 degrees and 90 degrees, and more particularly approximately 45 degrees. The nozzle vent 310 may be angled to direct the cooling air 305 at the heat generating component 340 to bring the cooling air 305 into contact with as much surface area of the heat generating component 340 as possible.

Figure 3B:
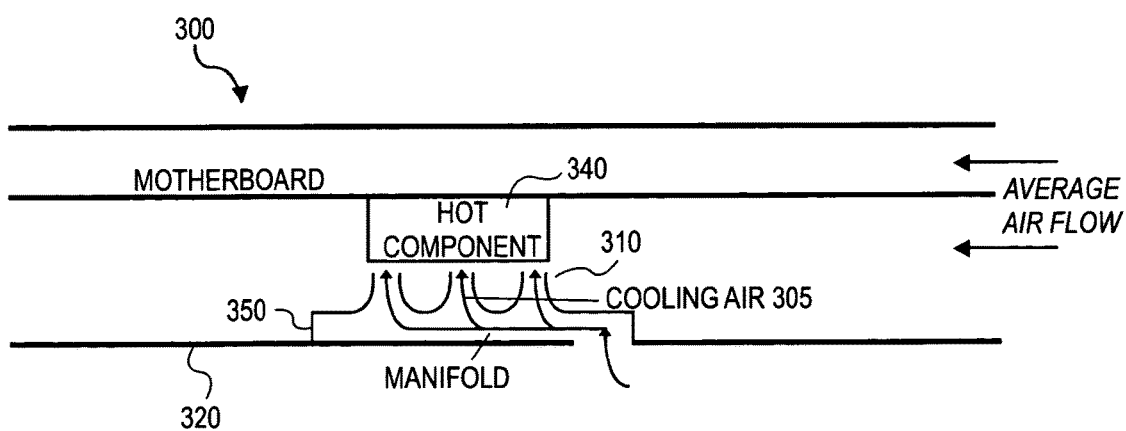
FIG. 3B is an illustration of a cross-sectional view of an embodiment of a manifold of nozzle vents.

FIG. 3B illustrates an embodiment of a mobile computing device 300 where a manifold 350 of nozzle vents 310 is used to distribute the cooling air 305 to specific locations of a heat generating component 340. The manifold 350 may also be used to direct cooling air 305 to more than one heat generating component 340. The nozzle vents 310 that are part of the manifold 350 may also be arranged at various angles relative to the external wall 320 to direct the cooling air 305 to strategic locations to maximize the cooling of the heat generating components 340.

Figure 4A:
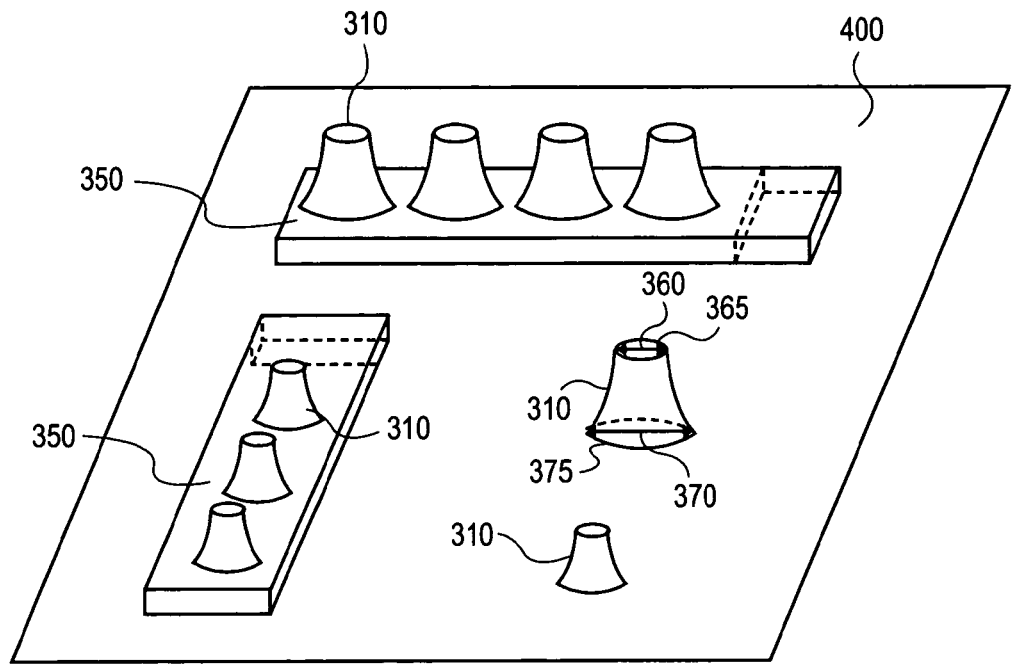
FIG. 4A illustrates an embodiment of an inside view of a wall having nozzle vents.
Figure 4B:
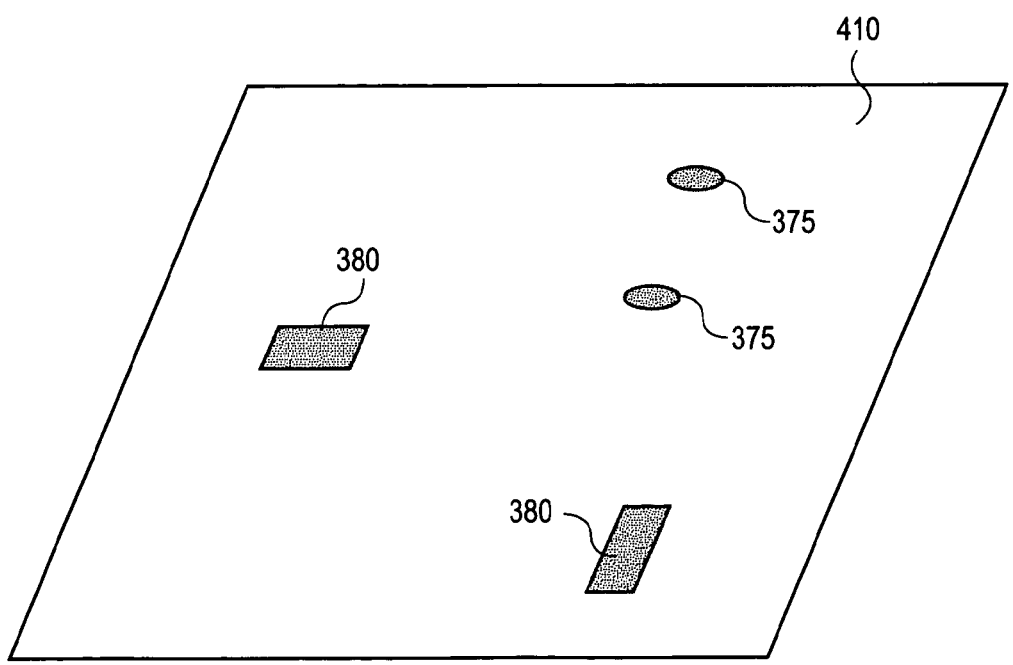
FIG. 4B is an illustration of an embodiment of an outside view of a wall having nozzle vents.

FIGS. 4A and 4B illustrate an embodiment of an external wall 320 of a mobile computing device 300. The external wall 320 of the FIGS. 4A and 4B has two manifolds 350 of nozzle vents 310 and two individual nozzle vents 310. These figures illustrate a portion of an embodiment of an external wall and are not meant to be limiting in any way. FIG. 4A illustrates the inside surface 400 of an external wall 320. The inside surface of the external wall 320 may have any arrangement of individual nozzles 310 and nozzle manifolds 350 possible, depending on the layout of the heat generating components 340 within the mobile computing device 300.

FIG. 4A illustrates one example of an outside surface 410 of the external wall 320 having one possible layout of nozzle vents 310. In one embodiment each of the nozzle vents 310 within the mobile computing device may have the same dimensions. In another embodiment, the dimensions of the nozzle vents 310 within the mobile computing device 300 may vary depending on the size of the heat generating components 340. The diameter 360 of the openings 365 and the diameter of the base 370 of the nozzle vents 310 may vary depending on the amount of cooling air 305 needed to cool down the heat generating components to a temperature sufficient to prevent the excessive heating of the external wall 320 of the mobile computing device. The diameter 360 of the openings 365 of the nozzle vents 310 and the diameter of the base 370 of the nozzle vents 310 may be varied depending on the size of the heat generating components 340 and the amount of cooling air 305 needed. In one embodiment, the diameter of the openings 365 of the nozzle vents may be in the approximate range of 2 millimeters (mm) and 5 mm and the diameter of the base 370 of the nozzle vents may be in the approximate range of 5 mm and 10 mm.

Alternatively a manifold 350 of nozzle vents 310 may be used to provide the necessary amount of cooling air 305. FIG. 4A illustrates two examples of a manifold 350 of nozzle vents 310. The manifolds 350 may have any number of nozzle vents 310 depending on the size and/or number of heat generating components 340 within the mobile computing device. The dimensions of the nozzle vents 310 that are part of a manifold 350 may be similar or different than the dimensions of the individual nozzle vents 310 on the inside surface of the external wall 320 of a mobile computing device 300. FIG. 4B illustrates the outside of the external wall 320, illustrating the base openings 375 of the nozzle vents 310 and the manifold openings 380. In an alternate embodiment, the external wall 320 may further include one or more louvered vents 110 to form an air curtain between the external wall 320 and the heat generating components 340 to create a buffer of cooler air between the external wall 320 and the heat generating component 340.

FIG. 5 illustrates a block diagram of an example computer system that may use an embodiment of the louvered vents 110 or nozzle vents 310 to cool the external walls or heat generating components of a mobile computing device. In one embodiment, computer system 500 comprises a communication mechanism or bus 511 for communicating information, and an integrated circuit component such as a processor 512 coupled with bus 511 for processing information. One or more of the heat generating components or devices in the computer system 500 such as the processor 512 or a chip set 536 may be cooled by an embodiment of the nozzle vents 310 in combination with the louvered vents 110 to cool the external walls of the mobile computing device.

Computer system 500 further comprises a random access memory (RAM) or other dynamic storage device 504 (referred to as main memory) coupled to bus 511 for storing information and instructions to be executed by processor 512. Main memory 504 also may be used for storing temporary variables or other intermediate information during execution of instructions by processor 512.

Firmware 503 may be a combination of software and hardware, such as Electronically Programmable Read-Only Memory (EPROM) that has the operations for the routine recorded on the EPROM. The firmware 503 may embed foundation code, basic input/output system code (BIOS), or other similar code. The firmware 503 may make it possible for the computer system 500 to boot itself.

Computer system 500 also comprises a read-only memory (ROM) and/or other static storage device 506 coupled to bus 511 for storing static information and instructions for processor 512. The static storage device 506 may store OS level and application level software.

Computer system 500 may further be coupled to a display device 521, such as a cathode ray tube (CRT) or liquid crystal display (LCD), coupled to bus 511 for displaying information to a computer user. A chipset, such as chipset 536, may interface with the display device 521.

An alphanumeric input device (keyboard) 522, including alphanumeric and other keys, may also be coupled to bus 511 for communicating information and command selections to processor 512. An additional user input device is cursor control device 523, such as a mouse, trackball, trackpad, stylus, or cursor direction keys, coupled to bus 511 for communicating direction information and command selections to processor 512, and for controlling cursor movement on a display device 512. A chipset, such as chipset 536, may interface with the input output devices.

Another device that may be coupled to bus 511 is a hard copy device 524, which may be used for printing instructions, data, or other information on a medium such as paper, film, or similar types of media. Furthermore, a sound recording and playback device, such as a speaker and/or microphone (not shown) may optionally be coupled to bus 511 for audio interfacing with computer system 500. Another device that may be coupled to bus 511 is a wired/wireless communication capability 525.

Computer system 500 has a power supply 528 such as a battery, AC power plug connection and rectifier, etc.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. A mobile computing device, comprising:
   a component capable of generating heat;
   an external wall of a housing, wherein the housing houses at least the component; and
   a fixed louvered vent formed in the external wall and positioned to correspond with an outside edge of the component to allow external air to flow into the housing and redirect flow of the external air within the housing to create an air curtain positioned between and in contact with the external wall and the component, the air curtain flows in substantially a same direction as another airflow inside the housing, the air curtain supplements the another airflow inside the housing, wherein at least a portion of the air curtain is to be oriented along an interior side of the external wall and is to prevent heating of the external wall by the component by deflecting at least a portion of the heat generated by the component from the external wall.

2. The mobile computing device of claim 1, wherein the mobile computing device is a laptop computer.

3. The mobile computing device of claim 1, wherein the component is a processor device on a motherboard.

4. The mobile computing device of claim 3, wherein the processor device comprises a central processing unit.

5. The mobile computing device of claim 3, wherein the motherboard is oriented substantially parallel to the external wall and at least a portion of the air curtain.

6. The mobile computing device of claim 1, wherein a shape of the louvered vent is designed to draw the external air from outside of the external wall into the housing to form the air curtain.

7. The mobile computing device of claim 1, wherein the louvered vent extends from an inside surface of the external wall into the housing.

8. The mobile computing device of claim 1, wherein the component comprises a chipset.

9. The mobile computing device of claim 1, wherein the louvered vent is formed of a metal.

10. The mobile computing device of claim 1, wherein at least one dimension of the louvered vent corresponds to a physical dimension of the component.

11. The mobile computing device of claim 1, wherein the louvered vent is one of a plurality of louvered vents positioned to create the air curtain along the external wall.

12. The mobile computing device of claim 11, wherein at least one other louvered vent in the plurality of vents is positioned to correspond to another component housed in the housing.

13. The mobile computing device of claim 1, wherein the external wall forms a bottom surface of the housing.

14. A laptop computing device comprising:
a plurality of computing components, wherein at least a particular component of the plurality of computing components is capable of generating heat;
a housing to at least partially house the plurality of computing components, wherein the housing conducts heat, the housing comprises an external wall forming a bottom surface of the laptop computing device, and the external wall comprises a fixed louvered vent formed in the external wall and positioned to correspond with an outside edge of the at least a particular component to allow external air to flow into the housing and redirect flow of the external air within the laptop computing device to create an air curtain positioned between and in contact with the external wall and the at least a particular component, the air curtain flows in substantially a same direction as another airflow inside the housing, the air curtain supplements the another airflow inside the housing, wherein at least a portion of the air curtain is to be oriented along an interior side of the external wall and is to prevent heating of the bottom surface of the laptop computing device by the at least a particular component by deflecting at least a portion of the heat generated by the at least a particular component from the external wall.

15. A mobile computing device housing, comprising:
an external wall comprising one or more fixed louvered vents positioned on the external wall to correspond to one or more heat generating internal components of a computing device to be housed within the housing, wherein each of the louvered vents is positioned to correspond to an outside edge of the corresponding one of the one or more internal components, and each of the louvered vents is to allow external air to flow into the housing and redirect flow of the external air within the housing to create an air curtain positioned between and in contact with the external wall and a corresponding one of the one or more internal components, the air curtain flows in substantially a same direction as another airflow inside the housing, the air curtain supplements the another airflow inside the housing, wherein the air curtain is to be oriented along an interior side of the external wall and is to prevent heating of the external wall of the computing device by the corresponding one of the one or more internal components by deflecting at least a portion of the heat generated by the one or more internal components from the external wall.

16. The mobile computing device housing of claim 15, wherein the one or more fixed louvered vents comprise a plurality of louvered vents.

17. The mobile computing device housing of claim 15, wherein the external wall is to comprise a bottom surface of the computing device.

18. The mobile computing device housing of claim 17, wherein the computing device comprises a laptop computer.

19. The mobile computing device housing of claim 17, wherein the one or more louvered vents are to assist in minimizing the heating of the bottom surface of the computing device by the one or more heat generating internal components.

* * * * *

UNITED STATES PATENT AND TRADEMARK OFFICE
CERTIFICATE OF CORRECTION

| | |
|---|---|
| PATENT NO. | : 9,851,766 B2 |
| APPLICATION NO. | : 14/919271 |
| DATED | : December 26, 2017 |
| INVENTOR(S) | : Rajiv K. Mondia and Sridhar V. Marchioutu |

It is certified that error appears in the above-identified patent and that said Letters Patent is hereby corrected as shown below:

In Column 7, Line 25, in Claim 14, delete "a particular component" and insert -- the particular component --, therefor.

In Column 7, Line 29, in Claim 14, delete "a particular component" and insert -- the particular component --, therefor.

In Column 7, Line 37, in Claim 14, delete "a particular component" and insert -- the particular component --, therefor.

In Column 7, Line 38, in Claim 14, delete "a particular component" and insert -- the particular component --, therefor.

Signed and Sealed this
Fifteenth Day of May, 2018

Andrei Iancu
*Director of the United States Patent and Trademark Office*